United States Patent [19]

Skerlos

[11] 4,280,140

[45] Jul. 21, 1981

[54] MICROCOMPUTER-CONTROLLED ONE-STEP-BACK AUTOMATIC FREQUENCY CONTROL TUNING SYSTEM

[75] Inventor: Peter C. Skerlos, Arlington Heights, Ill.

[73] Assignee: Zenith Radio Corporation, Glenview, Ill.

[21] Appl. No.: 107,732

[22] Filed: Feb. 19, 1980

[51] Int. Cl.³ .......................... H04N 5/44; H04B 1/26
[52] U.S. Cl. ................................. 358/195.1; 455/182; 455/183; 455/184; 455/186
[58] Field of Search ............... 455/164, 165, 180, 182, 455/183–186, 192; 358/191.1, 195.1

[56] References Cited

U.S. PATENT DOCUMENTS

| | | | |
|---|---|---|---|
| 4,025,953 | 5/1977 | Sideris | 358/195.1 |
| 4,041,535 | 8/1977 | Rzeszewski et al. | 358/195.1 |
| 4,093,922 | 6/1978 | Buss | 455/186 |
| 4,109,283 | 8/1978 | Rast | 455/182 |

OTHER PUBLICATIONS

"A Microcomputer Controlled Frequency Synthesizer For TV" by Rzeszewski et al., 2/1978.

Primary Examiner—Jin F. Ng
Attorney, Agent, or Firm—Thomas E. Hill

[57] ABSTRACT

An electronic, microcomputer-controlled television tuning system capable of acquiring channels offset by as much as 3.25 MHz from the designated frequency while also being able to accurately tune in channels operating at the designated frequency. After synthesizing the correct channel frequency, the microcomputer looks at AFC discriminator information from which local oscillator tuning voltage direction is determined. To achieve automatic fine tuning the tuning voltage is then stepped by the microcomputer in small frequency increments which vary from 28 KHz for channel 2 to 90 KHz for channel W in the direction of the desired frequency until the center video carrier frequency is passed. The tuning voltage is then returned to the preceding step to which frequency the receiver is then locked. With essentially all broadcasting stations operating at, or very close to, the FCC-designated frequency, highly accurate tuning to the selected channel is thus permitted. Video carrier verification is accomplished by microcomputer analysis of AFC discriminator and vertical sync states.

10 Claims, 10 Drawing Figures

MICROCOMPUTER-CONTROLLED ONE-STEP-BACK AUTOMATIC FREQUENCY CONTROL TUNING SYSTEM

CROSS REFERENCE TO RELATED APPLICATIONS

This application is related to the following applications all of which are assigned to the assignee of the present application: Ser. No. 107,805, filed Dec. 27, 1979, entitled "Channel Number Entry System", in the name of Peter C. Skerlos; Ser. No. 157,573, filed June 9, 1980, entitled "Multi-Mode Automatic Channel Frequency Synthesis System", in the name of Peter C. Skerlos; and Ser. No. 164,716, filed June 30, 1980, entitled "Automatic Fine Tuning with Wide Band Automatic Frequency Control", in the name of Akio Tanaka.

BACKGROUND OF THE INVENTION

This invention relates generally to television tuning systems having automatic frequency control and specifically to television electronic tuning systems in which automatic frequency control is accomplished by microcomputer-controlled frequency synthesis.

Automatic frequency control (AFC) systems are, in general, well known in the art and typically involve heterodyning the transmitted signals picked up by the receiver's tuner with locally generated oscillator signals and producing intermediate frequency (IF) signals for processing. This frequency translation process is well known and is necessitated by a variety of factors including the inherent characteristics of the electronic components utilized. In television receivers the local oscillator frequency is adjusted by means of a control voltage to heterodyne with the picture carrier in producing an IF picture carrier of 45.75 MHz. Each television channel transmits at a different carrier frequency with the individual channels separated by a designated frequency increment of 6 MHz from channel to channel except for channels 5-6 (10 MHz), channels 6-7 (92 MHz, and channels 13-14 (260 MHz).

In processing the received television signals, a discriminator or detector having a tuning or center frequency of 45.75 MHz, corresponding to the picture IF, is supplied with the IF signal and develops an error voltage dependent upon the polarity of the difference between the received picture IF carrier and the center frequency of the discriminator. The error voltage is fed to appropriate circuitry in the tuner for controlling the frequency of the local oscillator based upon polarity and/or magnitude of this difference signal. Changes in the oscillator frequency in response to the error voltage are employed to bring the received picture IF carrier frequency in close coincidence with the center frequency of the detector. Tuning equilibrium is achieved when the error voltage produced and the system gain operate on the local oscillator to maintain tuning close to the detector center frequency at which point the receiver should be properly tuned, i.e., to within its specified frequency tolerance.

The proliferation of CATV, MATV and inexpensive television games has placed increasing demands on AFC systems. In some CATV or MATV installations, the channel oscillator frequencies are offset from the FCC-designated standard for broadcast transmitters. This frequency offset is intentionally introduced in these systems to reduce interference. The frequency offset in television video games is generally attributed to the wider tolerances in terms of nominal operating frequency, frequency stability, etc., of the oscillators utilized. To further complicate the situation the all-electronic television tuning systems currently being installed derive the channel number from the incoming signal, a preprogrammed memory or from the oscillator frequency. These all-electronic tuning systems do not incorporate the manually-operated fine tuning control which enabled the older tuning systems to receive the proper television signals even though the nominal oscillator frequency differed from its correct value. These difficulties have placed even more stringent tuning requirements on current AFC systems to acquire sometimes significantly offset video signals while simultaneously being able to precisely tune to those VHF and UHF channels which are operating at their designated frequency.

One approach taken in attempting to reconcile these competing objectives has involved the use of microcomputer-controlled tuning systems. These systems typically utilize a memory matrix for storing digital tuning data and updating stored tuning information periodically as dictated by tuning system control logic. One example of a digital computer-controlled approach to TV tuning is disclosed in U.S. Pat. No. 4,093,922. Involved therein is the use of a non-volatile ROM memory matrix for storing binary tune words which are updated either manually by external user control or by AFC tuning. The means of achieving digital AFC control is not disclosed in this patent wherein it is stated that the digital control system could be incorporated in the system by means of a couple of comparator windows and the addition of appropriate control logic to the system's algorithm. A typical AFC subroutine would involve the stepwise incrementing or decrementing of the tuning voltage over a particular tuning range corresponding to the selected channel. This approach leads to tuning inaccuracies because of its inherent incremental character wherein the channel being sought could be grossly mistuned by operating at a frequency located between two adjacent frequency steps and because of the difficulty in accurately measuring and adjusting to precise window and edge tuning information.

Another approach to improving television receiver tuning accuracy is disclosed in U.S. Pat. Nos. 4,041,535 and 4,025,953 wherein a frequency synthesis technique is utilized in tuning the television receiver to the desired channel. This approach involves the use to two programmable frequency dividers, the first connected between the output of a reference oscillator and one input to a phase comparator and the second connected between the output of a local oscillator and the other input to the phase comparator. The first programmable divider is controlled by the channel selector as the system tunes to the selected channel number. The second programmable divider receives inputs from logic circuitry which is responsive to predetermined relationships of signals from a picture carrier detector, a sound carrier, an AFT discriminator circuit, and the presence of vertical synchronization signal components. The phase comparator output is a tuning voltage used to control the tuning of the local oscillator. It is in this manner that the reference oscillator frequency supplied to the phase comparator is automatically changed to correct for received carrier signal frequency offset which may be in excess of the pull-in range of the AFT discriminator circuit. This approach, however, suffers from several performance limitations in that component ageing may change tuning system accuracy which this approach cannot compensate for and the RF environment in which the receiver actually operates may differ significantly from that which it was originally set up to operate in.

Another approach involving the microcomputer control of a television tuning system is disclosed in "A Microcomputer Controlled Frequency Synthesizer for TV", IEEE Transactions on Consumer Electronics, Volume CE-24, No. 2, May 1978, by Rzeszewski et al. The approach disclosed therein is very similar to that referred to in the previous paragraph with the addition of a microcomputer for controlling the phase lock loop (PLL) which is constantly correcting for drift in local oscillator phase insuring that the local oscillator is always precisely in phase with the fixed-frequency crystal oscillator. This provides for accurate input to the phase comparator which, in turn, controls the operation of the local oscillator. Automatic fine tuning is accomplished by changing the input to a programmable counter between the local oscillator and phase comparator. The step-wise operation of the programmable counter provides for frequency increment steps ranging from 28 KHz for channel 2 to 70 KHz for channel 13 for automatic off-set correction on VHF. Because the step-wise tuning operation ceases only upon detection of nominal carrier frequency cross-over, this approach can result in television receiver tuning errors of as much as approximately 28 KHz in the VHF band.

In accordance with the present invention, these tuning system limitations are substantially reduced by performing AFC functions under the control of a microcomputer in which a return function is executed during the stepwise tuning cycle to more accurately tune the receiver to the desired frequency. This approach provides the increased tuning flexibility not available in the conventional dedicated control circuit tuner. This flexibility is particularly desirable in an RF environment containing precisely tuned as well as grossly offset television channels.

OBJECTS OF THE INVENTION

Accordingly, it is an object of the present invention to provide a novel method of and system for tuning a television receiver utilizing an all-electronic tuner with a microcomputer-controlled AFC mode.

Another object of the present invention is to provide an indirect frequency synthesis, all-electronic television tuning system and process in which digital tuning data is stored in memory, periodically updated and recalled when processed by system control logic in accurately tuning to frequency offset broadcast channels as well as channels operating at designated frequencies.

Still another object of the present invention is to provide a microcomputer-controlled AFC television tuning system and process in which AFC discriminator information is provided to the microcomputer for the generation of digital tune words for controlling stepwise tuning adjustments.

BRIEF DESCRIPTION OF THE DRAWINGS

The appended claims set forth those novel features believed characteristic of the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DESCRIPTION OF THE PREFERRED EMBODIMENT

Figure 1:
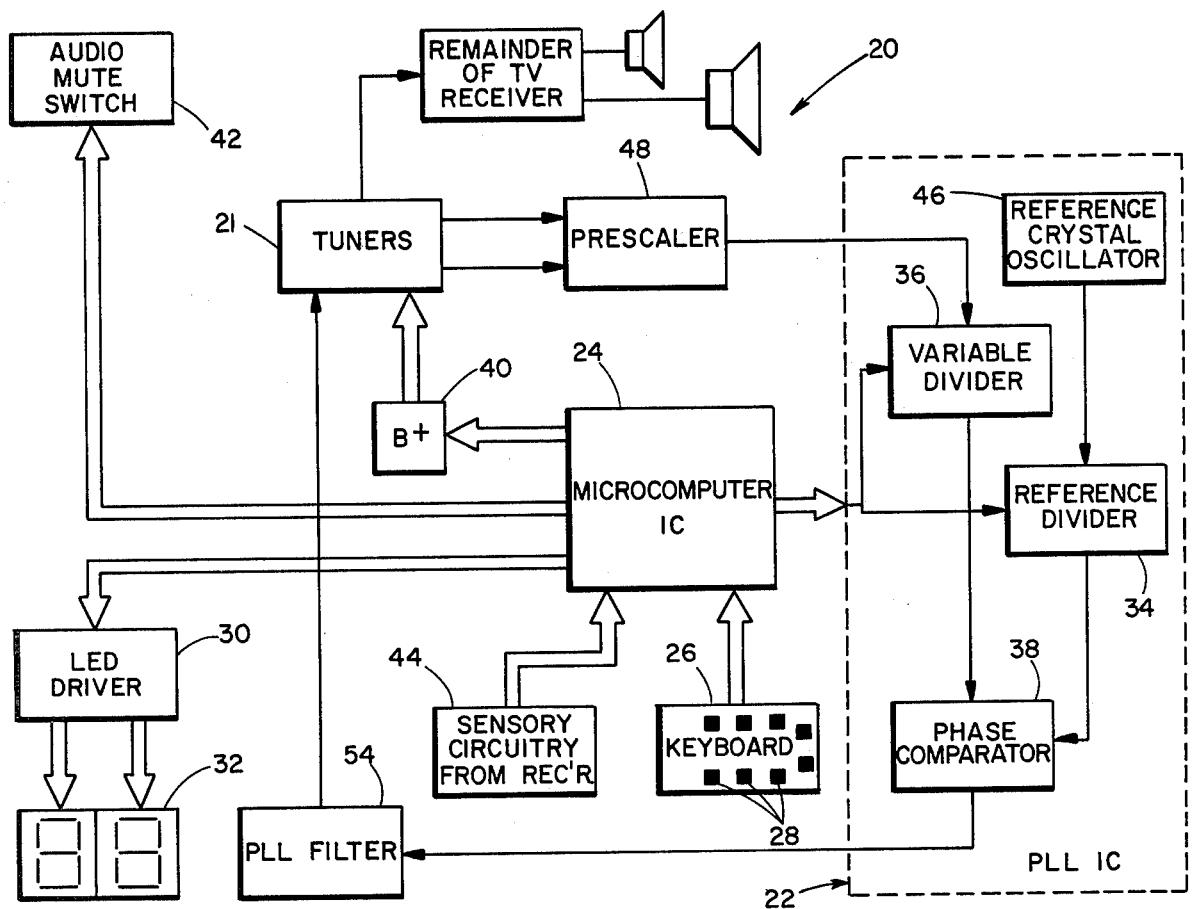
FIG. 1 is a simplified block diagram of a television tuning system with microcomputer-controlled AFC configured in accordance with the present invention.

Referring to the block diagram of FIG. 1, the microcomputer-controlled one-step-back automatic frequency control system 20 uses varactor tuners with a local oscillator 21 in conjunction with a phase lock loop (PLL) 22 to maintain crystal accuracy and stability of selected channels. A microcomputer 24 provides information storage, decision making logic and system control. Channel selection is made by keyboard 26 or by remote control (not shown) entry. Touch pads, or keys, 28 on the front panel of keyboard 26 provide direct entry of two digits to microcomputer 24. When the desired channel digits are entered the following events occur: (1) a microcomputer output signal to the LED drivers 30 activates the proper LED segments 32 to display the channel number selected; (2) the microcomputer 24 loads the correct divide ratio for the selected channel into the reference divider 34 and the variable divider 36 of the PLL 22 which alters its input frequency to the phase comparator 38; (3) the microcomputer 24 determines whether the channel selected is low VHF, high VHF, or UHF and applies the proper outputs to the U/V B+ switch and the VHF Hi/Lo band switch 40; and (4) the microcomputer 24 activates the audio mute switch 42. The sensory circuits 44 receive several inputs such as 45.75 MHz (picture carrier), 41.25 MHz (audio carrier), vertical sync, composite video and AFC voltage, and perform logic functions which provide signals to the microcomputer 24 indicating whether or not a broadcast signal is present and how accurately it is tuned.

Indirect frequency synthesis is utilized in the microcomputer-controlled one-step-back AFC tuning system 20 in which a PLL 22 utilizes the tuner local oscillator (L.O.) 21 as its voltage controlled oscillator (VCO). In the PLL 22, the reference crystal oscillator 46 frequency of 3.581055 MHz is divided by a 14 stage divider network, the reference divider or counter 34, to provide a 976.5626 Hz signal to the phase comparator 38. The other input to the phase comparator 38 is provided by the local oscillator in the tuner 21. The frequency division chain from the local oscillator in the tuner 21 to the phase comparator 38 is composed of a fixed divide by 256 prescaler 48, a fixed divide by four in the PLL chip and a ten stage variable divider or counter 36 in the PLL. The variable divider 36 divides by the numerical value of the frequency of the local oscillator in megahertz for the channel selected. The reference crystal oscillator 46 drives twelve stages of memory which are connected as an eight stage variable load and a four stage fixed load as the reference counter 34. The output of the reference counter 34 provides the second input to the phase comparator 38. There is also a fixed divide by five connected to the output of the reference counter 34 (not shown). The purpose of this extra divide by five counter is to provide a stable crystal controlled reference frequency for microcomputer 24.

When the signal from the variable counter 36 and the signal from the reference counter 34 to the phase comparator 38 are exactly equal, the comparator output is zero. When there is any difference in these two frequencies, the comparator 38 will develop an output which, when passed through the PLL filter 54, provides a correction voltage to the varactor tuner 21 to change the local oscillator frequency until the two signals have exactly the same frequency. The tuner oscillator 21 then assumes the stability of the crystal reference oscillator 46. This frequency comparison is done continually in order to compensate for tuner oscillator drift. In order for the comparator 38 to operate correctly the divided down oscillator frequency should always be about equal to the other comparator input of about 1 KHz. Since the oscillator frequencies are different for each channel, a different divide ratio must be used for each selected channel. For example, to tune in channel 2 the local oscillator frequency of 101 MHz must be divided by 101,000 to yield a 1 KHz signal to the comparator while to obtain channel 13 the local oscillator frequency of 213 MHz must be divided by 213,000. The operation is performed by programmable divider 36 which is controlled by microcomputer 24. In all, eight inputs are provided to the PLL integrated circuit (IC) 22 by microcomputer 24 to control its operation. Four of these inputs are data lines which receive serial data of 4-bit parallel words for controlling the various dividers. Three other inputs are data steering lines which determine to which registers the data will be sent. The eighth input is an "Enable" line which permits the microcomputer 24 to receive the correct data and exclude other information which may be present on the data line at different times.

Figure 2:
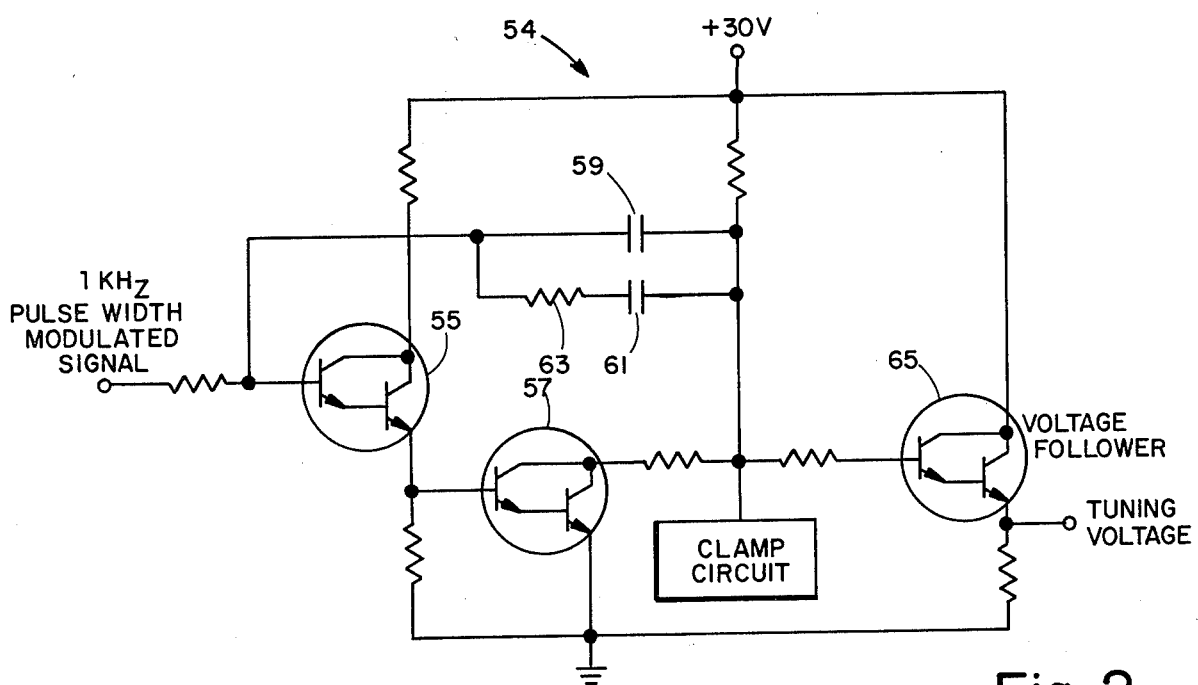
FIG. 2 is a circuit diagram of the active filter element in the phase lock loop (PLL) of the microcomputer-controlled AFC system.

The output of the phase comparator 38 is a series of pulses the duty cycle of which is dependent on the difference between the reference frequency (1 KHz) and the divided down local oscillator frequency. These pulses are filtered by the active PLL filter circuit shown in FIG. 2 resulting in a D.C. voltage with a negligible amount of 1 KHz ripple. No input pulse results in a high D.C. voltage and a high duty cycle pulses result in a low D.C. voltage. Once the nominal tuning voltage is established, the circuit acts like a sample and hold circuit and current is either added or subtracted from the base of transistor pair 55 in small quantities only when needed to correct for small frequency errors. Referring to FIG. 2, the input pulses are applied to the base of transistor pair 55. A darlington stage is used to maintain an extremely high input impedance. The output at the collector of transistor pair 57 is fed back to transistor pair 55 via capacitors 59 and 61 and resistor 63. This filtered D.C. voltage at the collector of transistor pair 57 is then routed through transistor pair 65 which acts as an emitter follower to provide a low impedance drive to the tuner. Attached to the base of transistor pair 65 is a clamp circuit. This circuit establishes a lower limit below which the output tuning voltage will not go on the high VHF band or midband CATV. This is done to prevent the tuner oscillator from stalling and ultimately making the system lock-out. The polarity of a phase change of the two signals going into the phase comparator 38 is such as to correct the local oscillator so that the output of its countdown is in synchronism with the output of the reference crystal oscillator 46. The PLL filter 54 thus provides adequate filtering of these correction signals so that there is no perturbation on the tuning line while allowing a quick response to a new tuning voltage.

Figure 3:
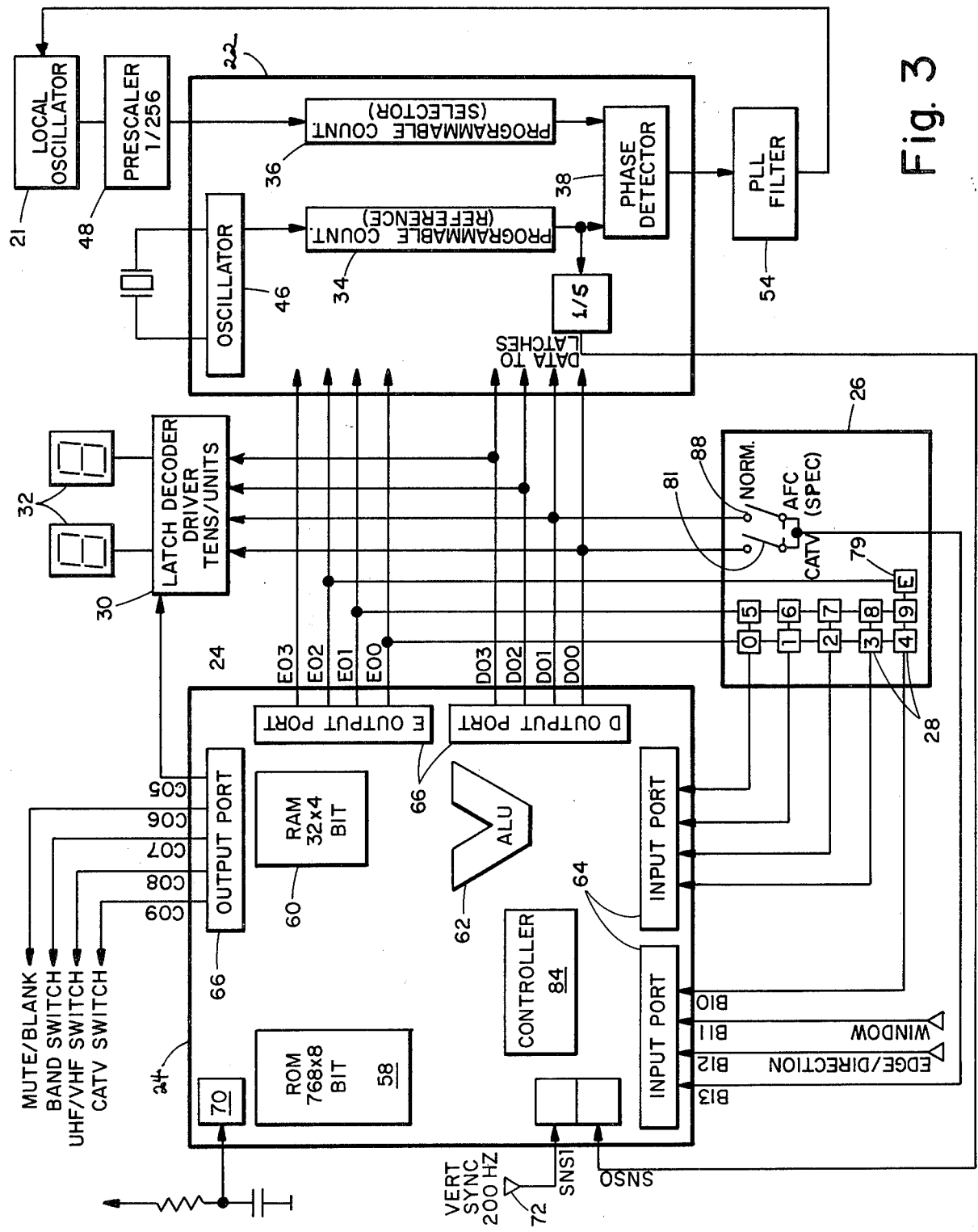
FIG. 3 is a block diagram of the microcomputer showing its interface wth the PLL circuit and peripheral systems.

Referring to FIG. 3, the microcomputer 24 is a four bit, E/D MOS unit with a ROM 58, a RAM 60, and arithmetic logic unit 62, input/output (I/O) ports, 64 and 66, respectively, and a clock generator 70 on a single semiconductor chip. The microcomputer stores data, periodically updates this stored data, compares both stored and real-time data and makes decisions based upon these comparisons in providing system control. The microcomputer chip is of the MN 1400 series basic design as manufactured by the Matsushita Electronics Corporation which has been specially modified for the present application. The RAM 60 has an X-register, Y-register matrix memory organization. The RAM's capacity is 32×4 bits with each word stored in a memory storage point consisting of 4 bits. Each bit may be used as a flag to indicate whether a particular event has occured or the individual bits can be used in combination in the form of a counter. The memory storage organization of the RAM can best be illustrated by referring to Table 1 wherein is shown the RAM map. For example, if the CATV switch is thrown the bit corresponding to the CATV memory storage location would be set to 1 by the program in the microcomputer. The output of the microcomputer's RAM would be 0100 with the 1 indicating that a flag has been set in the CATV memory storage location. This BCD word would then be transmitted by the microcomputer 24 to the phase lock loop 22 thereby initiating the generation of a new frequency and other tuning information. Memory locations are designated by M(X,Y) terminology. For example, the received channel designation would be located in the M(0,5) location (units) and the M(0,5) location (tens). Similarly, the display channel numbers would be stored in memory locations M(0,3) (units) and M(0,2) (tens). Information stored in RAM, which is a volatile memory, is lost when the receiver is turned off. When the television receiver is again turned on the microcomputer program initializes the data from ROM 58. Data transfer by RAM 60 is in binary coded decimal (BCD) format. The ROM 58 is a mask-generated, non-volatile, factory produced 768×8 bit memory matrix. Program instructions and data are stored in the ROM which has a 58 instruction capacity. Hexadecimal notation is used by the ROM from which instructions and data are sequentially removed by the system controller 84 in carrying out program functions.

The microcomputer receives sensory input signals on B10, B11, B12, SNS0 and SNS1. The sensors obtain their information from the television chassis and output control signals to the microcomputer for controlling the parameters of the phase lock loop. This information includes tuning frequency window (B11), tuning frequency edge (B12), the picture carrier (B10), system timing (SNS0) and vertical synchronization (SNS1). These input signals are processed and transformed into appropriate signals for driving the microcomputer by several comparators. The composite sync signal is passed through a low pass filter (not shown) to extract the vertical sync. This vertical sync signal is then passed through two comparators with only the vertical sync comparator 72 used for the seek mode. The vertical sync comparator 72 shapes up the vertical sync signal and converts it to the proper two level signal to drive the microcomputer 24.

signal processing scheme. Once the proper tuning direction is determined by the edge/direction comparator 76 the microcomputer then steps the AFC tuning voltage in increments of 28 to 90 KHz, with the smaller increments used for tuning in lower channels and the larger increments used for tuning in higher channels, until the limit of the number of allowed steps for that particular channel is reached. When this limit is reached and no valid carrier is found, tuning is switched to the other limit and the voltage stepping procedure is initiated again. If the tuning voltage is being stepped up, the microcomputer looks for a low to high transition of the edge/direction comparator 76 or the opposite transition if tuning proceeds in the opposite direction. When a voltage transition is detected, with 3 volts coinciding with the picture carrier frequency of 45.75 MHz, voltage stepping ceases, a correction is made for overshooting the 3 volts AFC control voltage-45.75 MHz picture carrier nominal point and the validity of the carrier is then tested. For the carrier to be valid, the output of the window comparators, 74 and 78, should be high (AFC voltage between 1 and 5 volts) and the vertical sync comparator 72 should produce a train of 60 Hz pulses, indicating the presence of vertical sync information.

During the time that the system is acquiring the de-

TABLE 1

| V SYNC DATA | AFC TIMING COUNT | | MFT TIMER 2 | MFT TIMER 1 | PLL REFERENCE LOWER LIMIT LATCH 1 | PLL REFERENCE UPPER LIMIT LATCH 1 | PLL REFERENCE DATA LATCH 1 | 1 1 |
|---|---|---|---|---|---|---|---|---|
| V SYNC OK FLAG | LOW LEVEL MEMORY | AFC OK FLAG/ | NOT AFC FLAG | | | KEY | KEY INPUT | |
| ......... | ......... | | | | | | | |
| V SYNC NO PULSE FLAG | LOW LEVEL | COMP. 1 LOW | COUNTER | | | BOUNCE | DATA | 0 |
| ......... | | | | | | | | |
| HIGH LEVEL COUNTER | COUNTER | COUNTER | | | | | | |
| F | E | D | C | B | A | 9 | 8 | X/Y |
| PLL REFERENCE DATA LATCH 0 | PLL SELECTOR DATA LATCH 4 | PLL SELECTOR DATA LATCH 3 | PLL SELECTOR DATA LATCH 2 | TIMER 3 | DISPLAY TIMER | TIMER 2 (32 MSEC.) | TIMER 1 (82 MSEC.) | 1 |
| | SOUND | RECEIVING | RECEIVING | DISPLAY | DISPLAY | UHF | AFC TIMING ENABLE | . |
| | ......... | | | | | ......... | ......... | |
| | MUTE FLAG | CHANNEL | CHANNEL | | | SUPER-BAND | STAND BY FLAG | |
| | ......... | | | CHANNEL | CHANNEL | ......... | ......... | |
| | VIDEO | | | NEL | | MID-BAND | CATV SW | |
| | MUTE FLAG | UNITS | TENS | UNITS | TENS | ......... HVHF | ......... AFC SW | 0 |
| 7 | 6 | 5 | 4 | 3 | 2 | 1 | 0 | X/Y |

Figure 4:
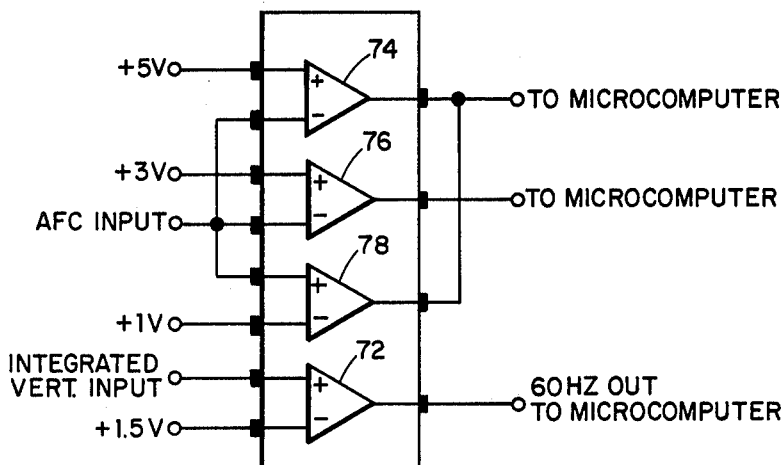
FIG. 4 shows the combination of the direction, window and vertical sync comparators utilized in acquiring the desired channel in the preferred embodiment of the present invention.

The output of window comparators 74 and 78 shares a common load with the edge/direction comparator 76 as shown in FIG. 4. When a channel is selected, the system will first synthesize the correct frequency for that channel. The microprocessor then looks at the output of the edge/direction comparator 76 to determine the direction of tuning. A high output indicates the need for tuning down. This process is illustrated in FIGS. 5A-5E where AFC voltages generated in response to various IF frequencies as they relate to the picture carrier (45.75 MHz) are shown together with the outputs of the various comparators utilized in this sired channel, the raster is blanked and the sound is muted. The correction made for overshooting the point of nominal stability on the AFC tuning curve, the 3 volt-45.75 MHz point, involves stepping the AFC voltage back to its value at the preceding step. This procedure of stepping the AFC tuning voltage back one increment permits the accurate tuning of channels operating on their designated frequency. As shown in FIG. 5B, direction information is provided by edge/direction comparator 76. The output of this comparator provides tuning information so as to permit accurate tuning to the nominally stable point of 3 volts AFC control voltage and 45.75 MHz picture carrier frequency. As shown in FIGS. 5C and 5D window information is provided by window comparators 74 and 78. As shown in FIG. 5E the output of these two window comparators is combined to provide window information in order to determine whether the tuning voltage is within the required tuning window. This tuning window extends from one volt to five volts. With these various inputs the microcomputer is able to determine whether to tune up or tune down.

Figure 6:
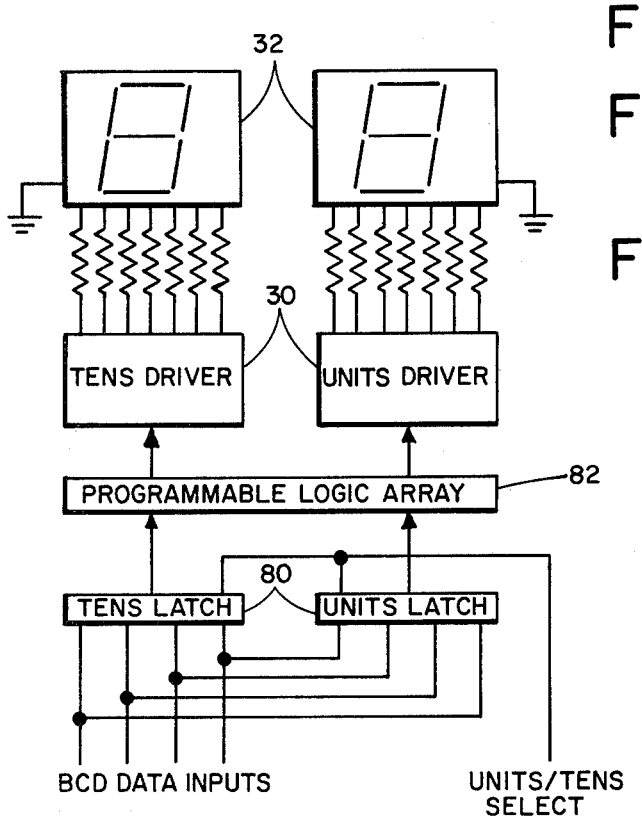
FIG. 6 shows the decoder/divider circuit for the L.E.D. channel selector display.

The LED circuit is also controlled by the microcomputer 24. The LED driver 30, as shown in FIG. 6, contains a latch circuit 80 which stores the BCD control signal information from the microcomputer 24 until it is updated. The four main control lines for the "units" data and the "tens" data are in parallel. The data select line, or programmable logic array 82, determines whether the information is for the tens digit or units digit. Tens digit information is loaded on the positive to negative transition of the signal on the data select line 82. Units digit information is loaded on the negative to positive transition of the signal on the data select line 82. The four bit binary code on the input lines is decoded internally by the programmable logic array (PLA) 82 into seven segment information for the LED display 32. The LED display 32 is a two-digit common cathode direct drive unit. When a new channel is selected by means of the ten-digit keyboard 26 the microcomputer 24 computes the correct number to load into the programmable counter 36 based upon the new channel number. The microcomputer 24 outputs this number in groups of 4 bits parallel on pins DO0 through DO3, addresses the appropriate latches in the phase lock loop 22 from EO0 through EO2, and loads the latches by an output on EO3. It also uses the same pins DO0 through DO3 to load the display drivers 30 with the correct information for this display on the two seven segment LED displays 32. This information is loaded by control output CO5. The microcomputer outputs additional control information for muting when there is no station present such as during a search when the system is between stations via CO6. Picture blanking control is provided by the CO6 output pin also. The microcomputer determines whether a new station is in low VHF, high VHF, or UHF and outputs the appropriate control signals on CO7 and CO8 for bandswitch and U/V switch.

Figure 7:
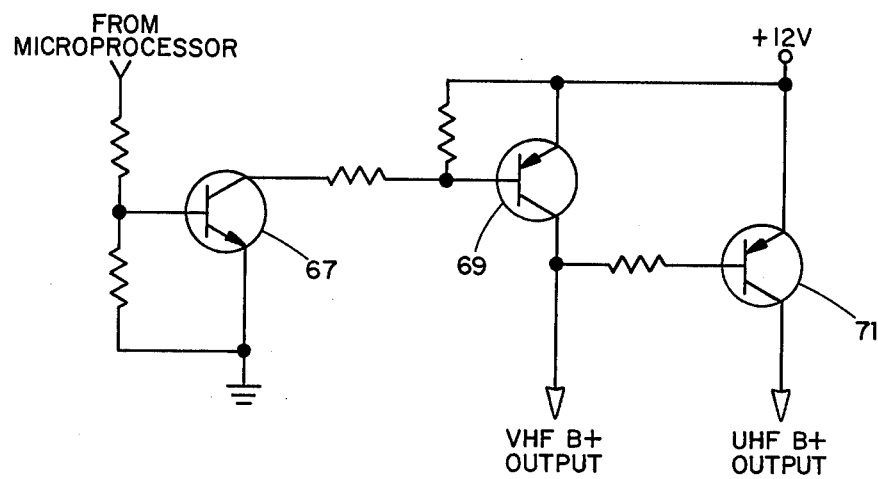
FIG. 7 shows the B+ switching circuit which is controlled by the microcomputer.

The B+ switching circuit as shown in FIG. 7 is also controlled by the microcomputer 24. The circuit consists of one NPN transistor 67 and two PNP transistors 69 and 71. When a VHF channel is selected, the microcomputer 24 will put a positive voltage on the base of transistor 67 causing it to conduct. Conduction of transistor 67 forces the base voltage on transistor 69 to drop below its emitter potential, causing it to conduct. When transistor 69 conducts, the 12 volt B+ source is effectively connected to the VHF tuner. The 12 volts on the collector of transistor 69 during conduction is also connected to the base of transistor 71. This insures that transistor 71 does not conduct when VHF channels are selected. On UHF channels, the output of the microcomputer is zero. Transistors 67 and 69 remain OFF allowing transistor 71 to conduct. Conduction of transistor 71 effectively connects the 12 volts to the UHF tuner.

Figure 8:
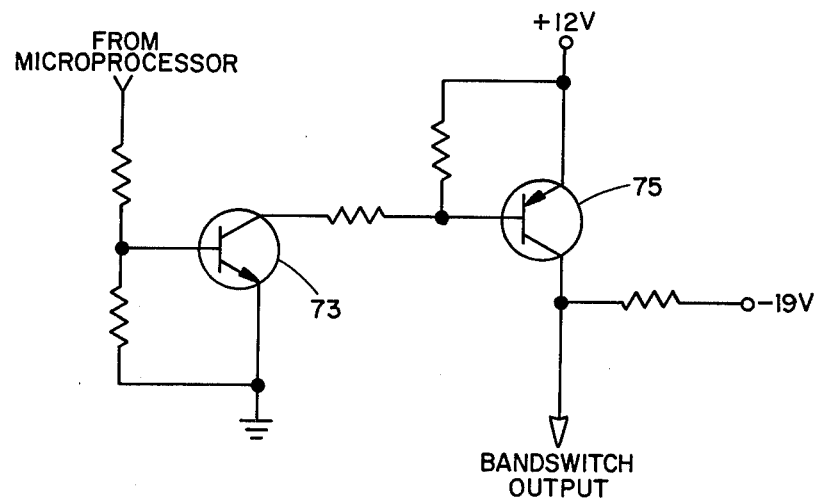
FIG. 8 shows the bandswitching circuit utilized in the microcomputer-controlled one-step-back AFC tuning sytem.

The band switching circuit is shown in FIG. 8. When a high band VHF channel is selected, the microcomputer 24 puts a positive voltage on the base of transistor 73 causing it to turn ON. Conduction of transistor 73 forces the base of transistor 75 to drop below its emitter potential, causing it to turn ON and to provide +12 V to the output. When a load-band VHF channel is selected (2-6) the microcomputer 24 output is zero. Transistors 73 and 75 remain OFF, producing no B+ output on the collector of transistor 75. At this time, the negative 19 volts which is connected to the collector through a resistor is applied to the switching diodes in the tuners to insure that they remain OFF. In this system all the B+ switching and band switching is done from +12 volts. Table 2 shows states of these lines in the accompanying figures for each band.

TABLE 2

| | VHF B+ | UHF B+ | BAND SWITCH | SUPER-BAND SWITCH | TUNING VOLTAGE (APPROX.) |
|---|---|---|---|---|---|
| Low VHF | On | Off | Off | Off | 1 to 10 |
| Midband CATV | On | Off | On | Off | 3 to 11 |
| High VHF | On | Off | On | Off | 11 to 23 |
| Superband | On | Off | On | On | 8 to 23 |
| UHF | Off | On | On | Off | 1 to 28 |

The microcomputer 24 constantly scans the keyboard 26 by sending pulses on three output scan lines. In scanning the keyboard 26, the microcomputer 24 looks for a user command and interrogates the position of the NORMAL/CATV switch 81 and the NORMAL/AFC (Special) switch 83. It does this by time multiplexing additional signals on EO0 through EO2 and DO0 through DO3. It senses a closure of the NORMAL/CATV switch 81, the NORMAL/AFC (Special) switch 88 and the 0 through 9 keys on A10 through A12. The three output scan lines are arranged in such a way as to represent the vertical X-axis of the keyboard 26 (3 vertical rows of keys). The horizontal Y-axis of the keyboard is represented by five output lines. When a key is depressed, the appropriate (X)-(Y) contact is made. The contact closure transfers the pulse back to the microcomputer 24 via one of the five output lines. The microcomputer detects the pulse, producing the desired light on the display.

The manner in which digital signals are processed in the microcomputer-controlled one step back AFC tuning system in controlling various tuner system components during the channel selection process will now be explained with reference to the flow chart shown in FIG. 9. In referring to FIG. 9, an oval symbol indicates the start of an operational sequence, a rectangle indicates an instruction or set of instructions resulting in the performance of a control function and a diamond indicates a decision point based upon the comparison of binary signal inputs.

POWER ON

Figure 9:
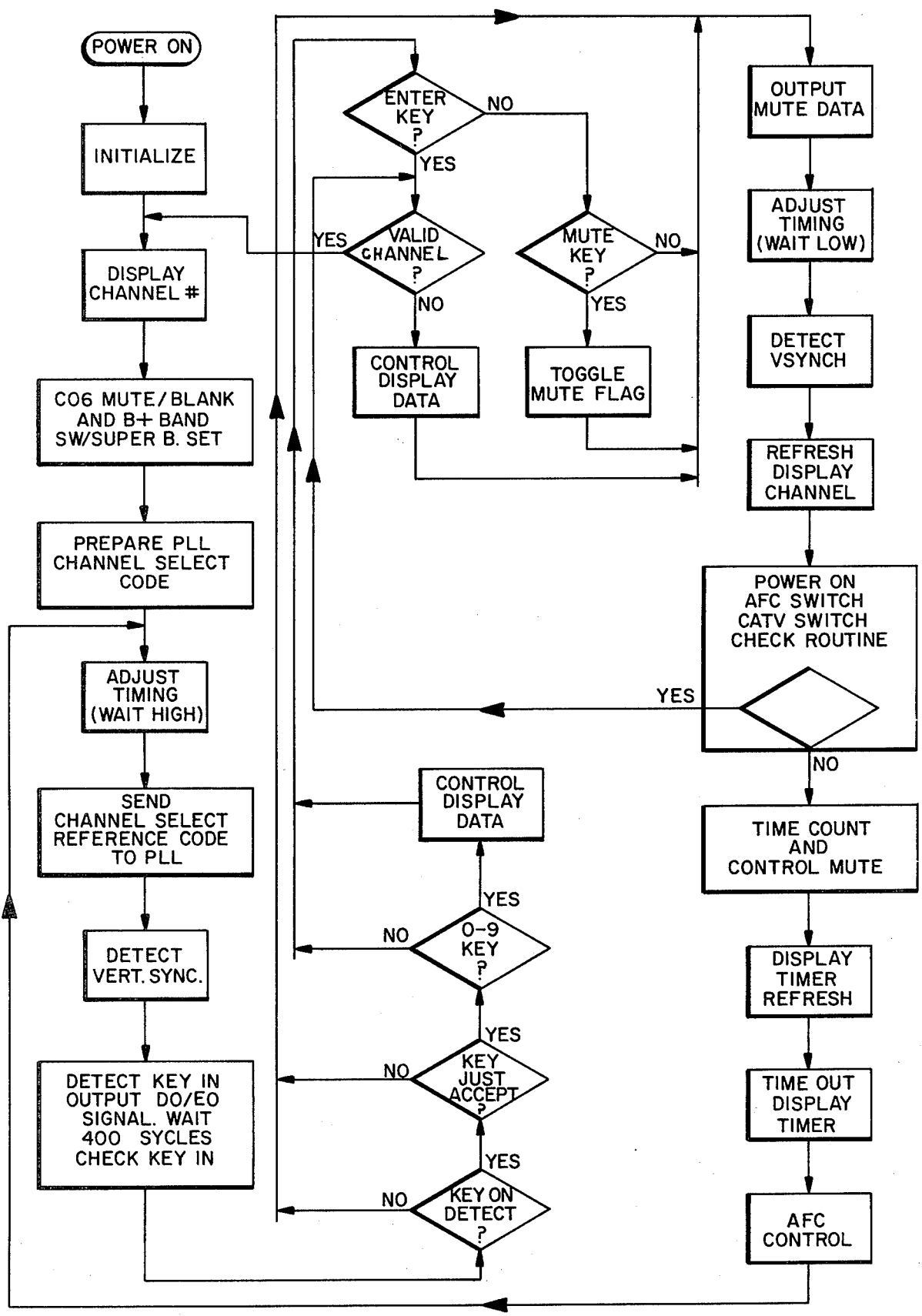
FIG. 9 shows the basic channel number entry and tuning control sequence implemented by the microcomputer.

As indicated in FIG. 9, power must be applied to the television receiver before the channel number entry process is initiated. The ROM 58 possessing a nonvolatile memory, retains stored data without power applied to the television receiver. The RAM 60, possessing a volatile memory, looses stored data when power is removed from the television receiver with the result that data must be again stored in RAM 60 when power is again applied to the television receiver.

INITIALIZE

The microcomputer 24 turns itself on when power is applied to the television receiver. Thereafter memory storage locations in the RAM 60 and other portions of microcomputer 24 are initialized to predetermined conditions established by outputs from the ROM 58. Data transferred from ROM 58 to RAM 60 includes program operating instructions and constants, e.g., tuning data, keyboard scanning data, etc. Instructions output by the ROM 58 are decoded by the microcomputer controller 84 before being transmitted to the various microcomputer control elements. Control logic in the form of the microcomputer's arithmetic logic unit (ALU) 62 then implements these instructions.

DISPLAY CHANNEL NUMBER

When power is initially applied to the television receiver, channel number 2 is presented on the LED display 32. Upon turning the television receiver "off" and then "on", the previously tuned to channel number will be recalled from RAM 60 and presented in the LED display 32. Upon power interruption to the television receiver the contents of the RAM 60 is erased with the result that upon reapplication of power channel number 2 will be presented in the LED display 32 and will be tuned to by the receiver.

CO6 MUTE/BLANK AND CO7, CO8, CO9 BANDSWITCH/B+/CATV SUPERBAND SET

Upon the decoding of channel number data by means of a set of instructions in ROM 58 and the display of the selected channel number, the microcomputer outputs control signals via the CO6 output terminal to the receiver sound and blank circuits. These output signals mute the sound and blank the video presentation during channel selection. CO7, CO8 and CO9 provide proper bandswitch, B+, and CATV switch voltages, respectively, to the appropriate tuning board for selected channel reception.

PREPARE PLL CHANNEL SELECT CODE

With the display channel number decoded by the microcomputer, appropriate tuning data is generated by programs in ROM 58 and stored in RAM 60 for transfer to the PLL 22. The CATV flag (High/Low), AFC flag, and the selected channel number provide the microcomputer 24 with the necessary inputs for generation of this PLL coded tuning data.

ADJUST TIMING

The microcomputer 24 then looks at the system clock as generated by the reference crystal oscillator 46 in the PLL the output of which is divided by the reference divider 34 to produce a 200 Hz clocking signal to which all system processes are synchronized. The microcomputer 24 then waits for a high to low transition of the timing pulse in establishing a timing reference signal from which all tuning steps are measured.

SEND CHANNEL SELECT REFERENCE CODE TO PLL

After system timing is established, the microcomputer 24 then sends the reference coded channel select tuning data to the PLL 22 where it is addressed to appropriate latches in providing inputs to the variable divider 36 and the reference divider 34.

DETECT VERTICAL SYNC

The microcomputer then compares frequency, amplitude and duty cycle of the received cycle with corresponding reference data stored in memory in detecting the presence or absence of a vertical sync signal.

DETECT KEY IN, OUTPUT DO/EO SIGNAL, WAIT 400 CYCLES, CHECK KEY IN

Depression of a key on keyboard 26 is then detected by microcomputer 24 by means of scanning signals output by the microcomputer output terminal groups DO and EO. The system then waits 400 cycles which is twice the program period in executing a key debounce routine to allow for keyboard entry stabilization and the rejection of spurious signals which occur only once in a given cycle. Following this 400 cycle interval the system then retransmits its keyboard scanning signals to allow for the detection of key depression. If a key input is accepted, data corresponding to that key is stored on RAM 60 for later use.

KEY ON DETECTED

The program then arrives at its first decision point at which key selection is determined followed by appropriate program branching. At this point in the program the system determines merely if a key has or has not been selected. The program has not yet determined whether a selected key is a numeric key, the "ENTER" key 79, or the mute key on the remote controller (not shown). However, at this point the program is able to sense whether an input signal represents a valid key selection, a spurious signal or an illegal entry. If a valid key entry is not detected the program proceeds to the OUTPUT MUTE DATA routine which will be described later. If a valid key entry is detected the program branches to the KEY JUST ACCEPTED routine.

KEY JUST ACCEPTED

The program then undergoes a detailed analysis in determining whether a valid or invalid key has been selected. It eliminates erroneous keying inputs such as multiple key entries, key bounce inputs, etc.

ZERO TO NINE KEY

The microcomputer 24 then checks RAM key data for a possible branch to the CONTROL DISPLAY DATA routine. If the key was not numeric the program branches to the ENTER KEY routine.

CONTROL DISPLAY DATA

If one of the numeric keys has been selected the appropriate input is provided by keyboard 26 to the decoder drivers 30 in presenting the selected channel number on the digital display 32.

ENTER KEY

Whether or not a numeric key has been selected the program then proceeds to the "ENTER" routine which checks to see if the channel number selected is a valid channel number or an illegal channel number. This is done by comparing the selected channel number with the contents of the microcomputer memory resulting in the erasure of the channel number from the digital display 32 if the channel number selected is illegal. The illegal channel number is then replaced with the previously selected channel number and the program continues to the OUTPUT MUTE DATA.

VALID CHANNEL

If the result of the ENTER KEY inquiry indicates that a valid channel has been selected the program proceeds to the VALID CHANNEL routine and from there branches back to the start of the channel entry program. If the VALID CHANNEL check indicates an invalid channel has been received the program proceeds to the CONTROL DISPLAY DATA routine.

CONTROL DISPLAY DATA

This routine exercises control over the channel number display and reverts the channel number indicator to the previously selected channel if an illegal channel number has been entered.

MUTE KEY

If the ENTER KEY check indicates a numeric key entry, the program branches to the MUTE KEY test which checks to see if the MUTE KEY has been selected on the remote controller (not shown). If the output of this test indicates that the MUTE KEY has been selected, the program executes a toggling of the mute flag thus inverting its state and thereby temporarily defeating the sound input. This muting occurs via remote control. If the MUTE KEY has been selected, the muting remains until the user hits the MUTE KEY again, toggling the system back to the unmuted state. The system incorporates a second mute flag controlled by tuning operations for muting the system during channel selection.

TOGGLE MUTE FLAG

The mute flag is toggled upon detection of selection of the MUTE KEY and thus results in an inversion in the state of the toggle mute flag and the resulting defeat of the sound output. If the output of the MUTE KEY flag indicates that the MUTE KEY has not been selected the program continues to the OUTPUT MUTE DATA routine.

OUTPUT MUTE DATA

If the key mute flag is high, the OUTPUT MUTE DATA routine mutes the television receiver sound output and proceeds to a system timing function. The sound will remain muted until remote control inverts the key mute flag. A second mute flag is controlled by tuning operations and temporarily mutes the sound only during tuning operations.

ADJUST TIMING

The ADJUST TIMING routine permits the program to idle at a low timing state looking for a transition from low to high before it continues on. A transition from low to high of the timing signal would establish the one-half period mark of program execution and thus tells the microcomputer when one-half of the program has been executed. The total program is executed in five milliseconds with this ADJUST TIMING routine set in the program at approximately the 2.5 millisecond point.

DETECT VERTICAL SYNC

Following the adjustment of program timing the program again looks for the presence of a vertical sync signal by monitoring frequency, amplitude and duty cycle of the received signal.

REFRESH DISPLAY PANEL

The program then recalls the selected channel number from RAM 60 and transmits appropriate signals to the LED display 32 every 5 milliseconds.

POWER ON/AFC SWITCH/CATV SWITCH CHECK ROUTINE

The program then looks at the status of the power switch. If the switch is off it idles, continuously testing the status of the power switch. If the result of this test indicates that the power switch is on, it continues in the program checking the status of the AFC and the CATV switches. If a change in state of any one of these three checks is sensed by the microcomputer the program is directed back to the VALID CHANNEL check. If the result of this routine indicates that the power switch is on or that the state of the AFC switch 88 or CATV switch 81 has not been changed since the last cycle of the program the program continues to the TIME COUNT AND CONTROL MUTE routine.

TIME COUNT AND CONTROL MUTE

This routine counts system clocking pulses to see if a predetermined period of time has expired and mutes system sound during this predetermined time period. In the present system the predetermined time period is set at 200 milliseconds.

DISPLAY TIMER REFRESH

In this routine the microcomputer updates display timer RAM data and once again recalls from RAM 60 the channel number and transmits appropriate data to the LED display 32 based on the timer data.

TIME OUT DISPLAY TIMER

Following the second program update of the digital display, the system then checks to see if the "ENTER" key 79 has been selected within 4.5 seconds of channel number entry. This is accomplished by the TIME OUT DISPLAY TIMER routine which causes the channel number display to revert to the previously selected channel number if the "ENTER" key is not selected within 4.5 seconds of channel number entry. This also results in the television receiver remaining tuned to the originally tuned-to channel. If the "ENTER" key 79 is selected within 4.5 seconds of channel number entry, the newly selected channel number remains displayed in the LED display 32 and the microcomputer 24 provides the phase lock loop 22 with appropriate tuning data to tune to the displayed channel number.

AFC CONTROL

Following the tuning to a new channel the program executes an AFC CONTROL routine in more accurately tuning in to the newly selected channel. The routine is bypassed if the AFC switch is in the "NORMAL" position for pure PLL operation. AFC control is independent of the 4.5 second "ENTER" key interval but is active after a new channel is tuned to only after 200 milliseconds, if the AFC switch is in the "SPECIAL" position.

Figure 10:
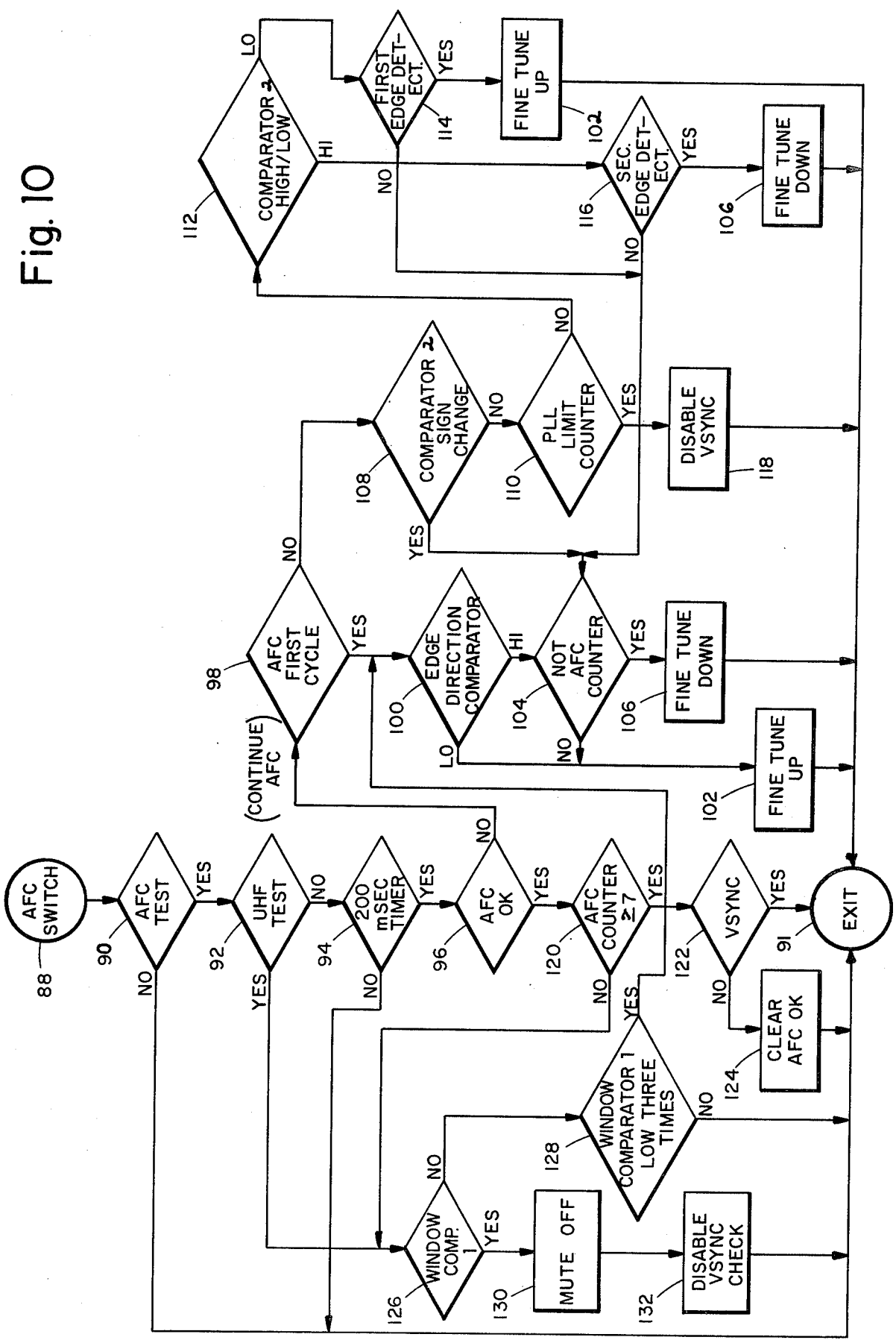
FIG. 10 shows the detailed AFC control routine utilized in the microcomputer-controlled one-step-back AFC tuning system.

The AFC program routine as executed in the microcomputer-controlled one-step back automatic frequency control system is shown in greater detail in FIG. 10. In order for the AFC program to be initiated the AFC SELECTOR switch 88 must be engaged. The status of the AFC SELECTOR switch 88 is continually scanned by microcomputer 24 resulting in the setting of the AFC flag test 90 if the AFC SELECTOR switch 88 is engaged. If the AFC SELECTOR switch 88 is engaged, the AFC routine proceeds to a UHF flag test 92. If the AFC SELECTOR switch 88 is not engaged, the program continues to the EXIT POINT 91 where it re-enters the general tuner program. If the output of the UHF flag test 92 is one, the program proceeds to WINDOW COMPARATOR flag test 126. If the output of the UHF flag test 92 is 0, the program proceeds to a 200 millisecond TIMER flag test 94 which provides a 200 millisecond settling time for the AFC system components prior to tuning. If the 200 millisecond period has not elapsed the output 200 millisecond TIMER test flag 94 is 0 and the program routes to the EXIT POINT 91 and then to the remainder of the tuner program. If the 200 millisecond period has elapsed, the program moves to the AFC OK test flag 96 which monitors the status of the AFC system. The AFC program periodically reads a 60 Hz timing signal and the microcomputer monitors transitions of the 60 Hz wave form with these transitions establishing system timing. If the output of the AFC OK test flag 96 is 0, the program proceeds to the AFC FIRST CYCLE test flag 98 to determine if this is the first execution of the AFC program. If it is the first execution of the AFC program, the program proceeds to the EDGE/DIRECTION COMPARATOR test flag 100 where the tuning voltage is compared with a 3 volt nominal tuning voltage. By means of the EDGE/DIRECTION COMPARATOR test flag 100 the decision is made as to whether to fine tune up or fine tune down. Fine tune up is controlled by the FINE TUNE UP CONTROLLER 102 while fine tune down is controlled by the FINE TUNE DOWN CONTROLLER 106. If the output of the EDGE/DIRECTION COMPARATOR test flag 100 is 1 in which case fine tuning must be in a downward direction, the program proceeds to the NOT AFC test flag 104 where the program determines whether to fine tune up or down based upon other computing data provided by sources other than the EDGE/DIRECTION COMPARATOR test flag 100 and which may indicate a tuning direction opposite to that indicated by the EDGE/DIRECTION COMPARATOR test flag 100. In this manner the NOT AFC counter 104 acts as a defeat of normal fine tuning program procedures.

Figure 5A:
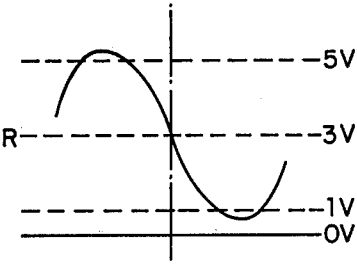
FIGS. 5A–5E illustrate the operating characteristics of the microcomputer-controlled, one-step-back automatic frequency control tuning system described herein where the system's intermediate frequency is shown as a function of the AFC tuning voltage together with the outputs of the various comparators utilized in signal processing.
Figure 5B:
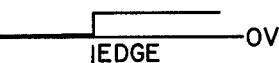
Figure 5C:
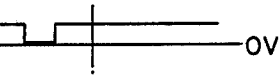
Figure 5D:
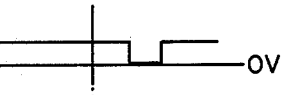
Figure 5E:

As can be seen in FIG. 5A, in some situations information in addition to tuning direction and window information is needed to correctly tune along the AFC tuning voltage curve to accurately tune in the picture carrier frequency of 45.75 MHz. Whether a fine tuning up or fine tuning down adjustment is made, the program then proceeds to the EXIT POINT 91. If the AFC FIRST CYCLE test flag 98 indicates that the system is not in a first AFC cycle the program then proceeds to the EDGE/DIRECTION COMPARATOR SIGN CHANGE test flag 108. The EDGE/DIRECTION COMPARATOR SIGN CHANGE test flag 108 compares the current sign of the AFC FIRST CYCLE test flag 98 with its previous sign and detects a change of state. If the sign change is detected by the EDGE/DIRECTION COMPARATOR SIGN CHANGE test flag 108, the program proceeds to the NOT AFC counter 104, looks for other tuning data other than from the AFC tuning routine and tunes up or down as required. The NOT AFC counter 104 looks carefully at edge information as applicable to the AFC tuning voltage curve shown in FIG. 5A. If no sign change is detected by the EDGE/DIRECTION COMPARATOR SIGN CHANGE test flag 108 the program proceeds to the PLL LIMIT counter 110 which determines if the phase lock loop high or low limits have been exceeded. If the phase lock loop limits have been exceeded, the program proceeds to the DISABLE VERTICAL SYNC control 118 and then proceeds to the EXIT POINT 91. If the phase lock loop limits have not been exceeded as determined by the PLL LIMIT counter 110, the program proceeds to the EDGE/DIRECTION COMPARATOR HIGH/LOW test flag 112. If the EDGE/DIRECTION COMPARATOR HIGH/LOW test flag 112 detects a low output the program proceeds to a FIRST EDGE DETECTOR test 114. If the output of the FIRST EDGE DETECTOR test 114 indicates the presence of an edge the system fine tunes up by means of the FINE TUNE UP control 106 and then proceeds to the EXIT POINT 91. If the output of the FIRST EDGE DETECTOR test 114 indicates the absence of an edge the system proceeds to the NOT AFC test flag 104 and fine tunes either up or down accordingly. If the output of the EDGE/DIRECTION COMPARATOR HIGH/LOW test flag 112 indicates a high output the program proceeds to a SECOND EDGE DETECTOR test 116. If the SECOND EDGE DETECTOR test 116 senses an edge indicating a transition from low to high the program proceeds to a FINE TUNE DOWN controller 102 by means of which the frequency is tuned down. If the output of the SECOND EDGE DETECTOR test 116 indicates a low output from the EDGE/DIRECTION COMPARATOR HIGH/LOW test flag 112, the program proceeds to the NOT AFC test flag 104 and fine tunes up or down as required.

The output of the EDGE/DIRECTION COMPARATOR HIGH/LOW test flag 112 indicates the current tuning state so that if the FIRST EDGE DETECTOR test flag 114 indicates the presence of an edge, the system has transitioned from a high to a low tuning state resulting in a tuning adjustment by the FINE TUNE UP controller 106. This tuning direction reversal is the equivalent to a one step backward adjustment in the incrementally stepped tuning voltage in order to more accurately tune to the desired channel. A similar one step backward tuning adjustment is made by the FINE TUNE DOWN controller 102 if the output of the EDGE/DIRECTION COMPARATOR HIGH/LOW test flag 112 is high and the SECOND EDGE DETECTOR 116 detects the presence of an edge. In this manner the program provides for accurate fine tuning to the desired channel.

The AFC OK test flag 96 is reset to 0 whenever any one of the following three conditions occurs:
 (1) when a new channel is selected.
 (2) when the AFC is turned Off, or
 (3) when the window and/or vertical synchronization is lost for three AFC cycles in a row. If the output of the AFC OK test flag 96 indicates that it is not engaged in the first AFC cycle, the program proceeds to the AFC 7 OK test flag 120. The AFC 7 OK test flag 120 detects how many times the AFC routine has been cycled through. If the number of cycles is greater than or equal to seven the program proceeds to the VERTICAL SYNC test flag 122. The VERTICAL SYNC test flag 122 senses the status of the reception of the vertical sync signal and if the vertical sync signal is being received the program proceeds to the EXIT POINT 91. If the vertical sync signal is not being properly received as indicated by the output of the VERTICAL SYNC test flag 122, the program proceeds to the CLEAR AFC OK flag test 124 which resets the AFC OK flag. The status of the AFC OK flag is then checked the next time the AFC is initiated by the AFC OK flag test 96. If the AFC 7 OK flag test 120 indicates that the AFC routine has not proceeded through 7 or more cycles, the program proceeds to the WINDOW COMPARATOR flag test 126 which determines if the AFC tuning voltage is between 1 and 5 volts. If the presence of the window is not detected the program proceeds to the WINDOW COMPARATOR LOW THREE TIMES flag test 128. If the result of this test indicates the window has not been low three times then the program branches to the EXIT POINT 91. If the WINDOW COMPARATOR LOW THREE TIMES flag test 128 indicates that the window has been low three times then the program branches to the EDGE/DIRECTION COMPARATOR flag test 100. From here the program either fine tunes up or down as required or utilizes NOT AFC flag test 104 tuning information in tuning to the selected channel.

If the output of the window comparator flag 126 indicates the presence of the tuning window the program proceeds to the MUTE OFF control 130 which turns the sound off during automatic fine tuning and turns it back on after automatic fine tuning is completed. FROM THE MUTE OFF control 130 the program proceeds to the DISABLED VERTICAL SYNC control 132 and then proceeds to the EXIT POINT 91 and the remaining portion of the tuning program. The computer listing for the AFC tuning process shown in FIG. 10 is presented in Table 3. Contained in this program assembly listing is such information as memory addresses, object code, statement number and additional source statement information. Detailed information on the symbology used in Table 3 is contained in the publication "MN 1400 Series: 4-Bit 1-Chip Microcomputer", published by Matsushita Electronics Corporation.

What has been shown is in all-electronic, indirect frequency synthesis automatic control frequency control television tuning system. Microcomputer control of the AFC routine permits accurate tuning response to tuning window and edge information. By detecting passage of the picture carrier during the step-wise tuning procedure on the AFC tuning curve and taking one step back in tuning voltage, the selected channel is accurately tuned in. Tuning information is stored in memory, periodically updated and recalled as needed to provide the accurate tuning for not only substantially offset channels but also for those operating close to the designated FCC frequency.

While particular embodiments of the invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective against the prior art.

TABLE 3

```
***                                    ***

LOC    OBJ    STMT  SOURCE STATEMENT 0491   98     1057         CI    8           NOT 1ST TIME XX01,XX10,0R00XX
0492   E2AA   1058         BNZ   SX30
0494   CA     1059         RM    8
0495   15     1060         IMB
0496   6C     1061  SY2    LY    12
0497   D4     1062         TR    4           COMP 2 CHECK
0498   E3A4   1063         BZ    SX20
049A   83     1064  SX10   SM    3           COMP 2 HIGH
049B   0D     1065  SI60   L
049C   D1     1066         TR    1
049D   E3A5   1067         BZ    SI50
049F   31     1068  SI40   LX    1
04A0   4F1E   1069         CAL   FTDN
04A2   413C   1070         JMP   SYSC1
04A4   C3     1071  SX20   RM    3           COMP2 LOW
04A5   31     1072  SI50   LX    1
04A6   4F05   1073         CAL   FTUP
04A8   413C   1074         JMP   SYSC1
04AA   DC     1075  SX30   TR    12          SIGN OF COMP 2 CHANGED LAST TIME
04AB   E3B1   1076         BZ    SX50
04AD   84     1077         AI    4
04AE   0A     1078         ST
04AF   449B   1079         JMP   SI60
04B1   31     1080  SX50   LX    1           AFC CYCLE COMPLETE?
04B2   67     1081         LY    7
04B3   0E     1082         LIC
04B4   93     1083         CI    3
04B5   E2BB   1084         BNZ   SX51
```

TABLE 3 (Cont'd)

```
LOC  OBJ    STMT       SOURCE STATEMENT

04B7 0D     1085              L
04B8 95     1086              CI    5
04B9 E363   1087              BZ    SY4
04BB 30     1088  SX51        LX    0
04BC 6C     1089              LY    12
04BD 15     1090              INB
04BE D4     1091              TR    4
04BF E3CB   1092              BZ    SX60        COMP 2 CHECK
04C1 0D     1093              L                 COMP 2 HIGH
04C2 B2     1094              SM    2
04C3 90     1095              CI    0           COMP 2 HIGH
04C4 E29B   1096              BNZ   SI60
04C6 84     1097              SM    4           EDGE DTECTED
04C7 6D     1098              LY    X'D'
04C8 B3     1099              SM    3
04C9 449F   1100              JMP   SI40

04CB 0D     1101  SX60        L                 COMP 2 LOW
04CC 93     1102              CI    3
04CD C2     1103              RM    2
04CE E29B   1104              BNZ   SI60
04D0 84     1105              SM    4           EDGE DETECTED
04D1 6D     1106              LY    X'D'
04D2 B3     1107              SM    3
0456 31     1009  SI00        LX    1
0457 20     1010              LD    0           MODE CHECK
0458 79     1011              ANDI  9
0459 91     1012              CI    1

045A E287   1013              BNZ   CEND1
045C 21     1014              LD    1           AFC MODE & AFTER 220MSEC
045D D8     1015              TR    8
045E E278   1016              BNZ   SY0
0460 6E     1017  SI01        LY    X'E'        WITHOUT UHF----AFC ENABLE
0461 0D     1018              L
0462 81     1019              AI    1
0463 0A     1020              ST
0464 E487   1021              BNC   CEND1
0466 BF     1022              SM    15          20MSEC PRESET FOR VXYNC CHECK
0467 30     1023  SI100       LX    0           AFC TIMING------SENSOR DETECTION
0468 6D     1024              LY    X'D'
0469 0D     1025              L                 AFC OK CHCK
046A E38F   1026              BZ    SI30
046C 2E     1027              ICM
046D 96     1028              CI    6

046E E578   1029              BC    SY0
0470 6F     1030              LY    15          VSYNC CHECK FOR 120MS
            1031  *                             M(0,D)=4,5,6
0471 0D     1032              L
0472 D8     1033              TR    8
0473 E387   1034              BZ    CEND1
0475 50     1035              LI    0           CLEAR M(0,D)
0476 4484   1036              JMP   SY1
0478 99     1037  SY0         CI    9           SET CF IF M(0,D)=0R>9
0479 62     1038              LY    2
047A 17     1039              SCO               WINDOW SCAN ON
047B C0     1040              RM    0
047C 15     1041              INB
047D 16     1042              RCO               WINDOW SCAN OFF
047E D8     1043              TR    8           COMP 1 CHECK
047F E389   1044              BZ    SY3
0481 4A96   1045              CAL   MTOP        JUST TUNE
0483 57     1046  SY4         LI    7           DISABLE VSYNC CHECK
0484 30     1047  SY1         LX    0
0485 6D     1048              LY    X'D'
```

TABLE 3 (Cont'd)

```
***                                              ***

LOC  OBJ     STMT  SOURCE  STATEMENT
0486 0A      1049          ST
0487 413C    1050  CEND1   JMP    SYSC1
0489 E487    1051  SY3     BNC    CEND1        COMP 1 LOW 3 TIMES CONTINUOUSLY ?
048B 6D      1052          LY     X'D'
048C 2F      1053          DCM                 FINE TUNE AGAIN
048D 4496    1054          JMP    SY2
048F 6C      1055  SI30    LY     12
0490 0D      1056          L
```

I claim:

1. A method for tuning a television receiver having automatic frequency control to the carrier frequency of a selected broadcast channel with an associated channel number including generating a variable frequency signal by means of a local oscillator, generating a reference frequency signal by means of a reference oscillator, and generating a local oscillator correction signal for matching an intermediate frequency signal derived from said local oscillator signal and the carrier frequency signal with a predetermined nominal intermediate frequency signal, said method being characterized by the use of a microcomputer and comprising:

generating binary signals representing first and second digital tune words, said digital tune words representing a selected channel;

storing said first and second digital tune words in a first data memory in said microcomputer;

reading said first and second digital tune words from said first memory and generating a divided-down local oscillator frequency by the use of said first digital tune word and a divided-down reference oscillator frequency by the use of said second digital tune word;

comparing said divided-down local oscillator and reference frequencies and generating a control signal representative of the difference in frequency of said divided-down local oscillator and reference frequencies;

coupling said control signal to said local oscillator for causing it to be locked to the frequency of said received carrier signal;

mixing the local oscillator frequency signal and the carrier frequency signal to generate an intermediate frequency signal;

comparing said intermediate frequency signal with said predetermined nominal intermediate frequency signal and providing a tuning voltage to said microcomputer, said tuning voltage being indicative of the magnitude and direction of a tuning error between said intermediate frequency signal and said predetermined nominal intermediate frequency signal;

incrementally adjusting the reference oscillator frequency by means of a tuning signal provided to said reference oscillator by said microcomputer in response to said tuning voltage;

detecting when the incrementally changing, divided-down reference oscillator frequency causes the intermediate frequency signal to pass said predetermined nominal intermediate frequency signal; and incrementally stepping the divided-down reference oscillator frequency back a predetermined number of steps following the passage of said predetermined nominal intermediate frequency signal by said intermediate frequency signal in tuning said television receiver to the selected channel.

2. The method of claim 1 wherein the incremental adjusting of said reference oscillator frequency by said tuning signal provided to said reference oscillator by said microcomputer comprises the steps of:

determining if said intermediate frequency signal is within a restricted frequency range or window about the frequency of said predetermined nominal intermediate frequency signal, said frequency range defined by an upper and lower limit;

adjusting the frequency of said reference oscillator upward in a step-wise manner if said intermediate frequency signal is within said range but below the frequency of said nominal intermediate frequency signal; or adjusting the frequency of said reference oscillator downward in a step-wise manner if said intermediate frequency signal is within said range but above the frequency of said nominal intermediate frequency signal.

3. The method of claim 2 wherein the step-wise incremental adjusting of the reference oscillator frequency further comprises the steps of:

storing in a second memory in said microcomputer said incremental adjustments to the reference oscillator frequency; and reading from said second memory said incremental adjustment values and providing said adjustment values to said reference oscillator in adjusting the reference oscillator frequency in matching said intermediate frequency signal with said nominal intermediate frequency signal.

4. The method of claim 3 wherein the step-wise incremental adjusting of the reference oscillator frequency further comprises the step of:

increasing the magnitude of said incremental adjustments to said reference oscillator frequency with increasing selected channel number in matching said intermediate frequency signal with said nominal intermediate frequency signal.

5. The method of claim 4 wherein said incremental adjustments are initiated at a nominal reference oscillator frequency, said nominal reference oscillator frequency representing that frequency required to match said intermediate frequency signal with said nominal intermediate frequency signal for a selected channel and a given carrier signal frequency.

6. The method of claim 5 further including the step of changing the local oscillator frequency to a value corresponding to an intermediate frequency at the upper or lower limit of said restricted frequency range or window about the predetermined nominal intermediate frequency signal when the lower or upper limit, respectively, of said restricted frequency range is reached in incrementally changing the reference oscillator frequency without detecting said carrier frequency signal.

7. The method of claim 6 further including verifying the presence of the carrier signal of a selected channel comprising the steps of:
   storing in said second memory vertical synchronization signal data; and
   reading said vertical synchronization signal data from memory and comparing said signal data with the intermediate frequency signal.

8. The method of claim 1 wherein the local oscillator frequency is divided by a first digital tune word M generated by said microcomputer in coarse tuning said television receiver to the selected channel and the reference oscillator frequency is divided by a second digital tune word N generated by said microcomputer in fine tuning said television receiver to the selected channel where M is greater than N.

9. The method of claim 1 wherein the incremental stepping back of the divided-down reference oscillator frequency comprises the stepping of said divided-down reference oscillator frequency to its value immediately preceding the passage of said predetermined nominal intermediate frequency signal in tuning said television receiver to the selected channel.

10. A method for tuning a television receiver having automatic frequency control to the carrier frequency of a selected channel with an associated channel number including generating a variable frequency signal by means of a local oscillator, generating a reference frequency signal by means of a reference oscillator, and generating a local oscillator correction signal for matching an intermediate frequency signal derived from said local oscillator signal and said carrier frequency signal with a predetermined nominal intermediate frequency signal, said method being characterized by the use of a microcomputer and comprising:
   generating binary signals representing a first digital tune word M and a second digital tune word N by said microcomputer, said digital tune words representing a selected channel;
   storing said first and second digital tune words in a first data memory in said microcomputer;
   reading said first and second digital tune words from said first data memory and dividing the local oscillator signal by said first digital tune word M and dividing the reference oscillator signal by said second digital tune word N for generating divided-down local and reference oscillator frequency signals in coarse tuning and fine tuning, respectively, said television receiver to the selected channel, where M is greater than N;
   comparing said divided-down local oscillator and reference oscillator frequency signals and generating a control signal representative of the difference in frequency of said divided-down local oscillator and reference oscillator frequency signals;
   coupling said control signal to said local oscillator for causing it to be locked to the frequency of said received carrier signal;
   mixing the local oscillator frequency signal and the carrier frequency signal to generate an intermediate frequency signal;
   comparing said intermediate frequency signal with said predetermined nominal intermediate frequency signal and determining if said intermediate frequency signal frequency is within a restricted frequency range or window about the frequency of said nominal intermediate frequency signal, said frequency range defined by an upper and lower limit;
   providing a tuning voltage to said microcomputer, said tuning voltage indicative of the magnitude and direction of a tuning error between said intermediate frequency signal and said predetermined nominal intermediate frequency signal;
   incrementally adjusting the reference oscillator frequency by means of a tuning signal provided to said reference oscillator by said microcomputer in response to said tuning voltage, said tuning signal adjusting the frequency of said reference oscillator upward in a step-wise manner if said intermediate frequency signal is within said frequency range but below the frequency of said nominal intermediate frequency signal or adjusting the frequency of said reference oscillator downward in a step-wise manner if said intermediate frequency signal is within said frequency range but above the frequency of said nominal intermediate frequency signal;
   storing in a second memory in said microcomputer said incremental adjustments to the reference oscillator frequency;
   reading from said second memory said incremental adjustment values and providing said adjustment values to said reference oscillator in adjusting the reference oscillator frequency in matching said intermediate frequency signal with said nominal intermediate frequency signal;
   detecting when the incrementally changing, divided-down reference oscillator frequency causes the intermediate frequency signal to pass said predetermined nominal intermediate frequency signal; and
   returning the divided-down reference oscillator frequency to its value immediately preceding the passage of said predetermined nominal intermediate frequency signal by said intermediate frequency signal in tuning said television receiver to the selected channel.

* * * * *